United States Patent
Koeda et al.

(10) Patent No.: US 7,147,795 B2
(45) Date of Patent: Dec. 12, 2006

(54) METHOD FOR SURFACE TREATMENT

(75) Inventors: Hiroshi Koeda, Suwa (JP); Katsuji Arakawa, Chino (JP); Kazufumi Oya, Suwa (JP)

(73) Assignee: Seiko Epson Corporation (JP)

( * ) Notice: Subject to any disclaimer, the term of this patent is extended or adjusted under 35 U.S.C. 154(b) by 272 days.

(21) Appl. No.: 10/953,879

(22) Filed: Sep. 29, 2004

(65) Prior Publication Data

US 2005/0095811 A1 May 5, 2005

(30) Foreign Application Priority Data

Sep. 30, 2003 (JP) ............................. 2003-339322
Jun. 9, 2004 (JP) ............................. 2004-171943

(51) Int. Cl.
*B44C 1/22* (2006.01)

(52) U.S. Cl. ...................... 216/83; 216/83; 414/217; 427/534; 427/535; 427/561; 427/98.5; 427/98.8; 438/689

(58) Field of Classification Search ................. 216/83; 427/534, 535; 414/217; 438/689
See application file for complete search history.

(56) References Cited

U.S. PATENT DOCUMENTS 5,522,975 A 6/1996 Andricacos et al.
6,517,967 B1 2/2003 Shrim et al.

2003/0077150 A1 * 4/2003 Matsuda et al. ............ 414/217

FOREIGN PATENT DOCUMENTS

FR 2831148 4/2003
JP 07-111257 4/1995

OTHER PUBLICATIONS

Patent Abstracts of Japan re: publication No. 07111257. no date.
Communication from European Patent Office re: related application. no date.

* cited by examiner

*Primary Examiner*—Nadine Norton
*Assistant Examiner*—Maki Angadi
(74) *Attorney, Agent, or Firm*—Harness, Dickey & Pierce, P.L.C.

(57) ABSTRACT

A method for surface treatment includes: a first step in which a surface treatment apparatus 1 and a substrate 10 in a state where a front surface 102 of the substrate 10 faces the surface treatment apparatus 1 are conveyed to the inside of a decompression chamber to decompress a plurality of concave portions 32 (enclosed spaces); a second step in which the surface treatment apparatus 1 and the substrate 10 are brought out from the inside of the decompression chamber to environment under atmospheric pressure in a state where the substrate 10 is being attracted to the surface treatment apparatus 1 with the use of a difference between negative pressure inside the concave portions 32 and atmospheric pressure; and a third step in which the surface treatment is carried out to a back surface 101 of the substrate 10 with the substrate 10 being attracted by the surface treatment apparatus 1.

19 Claims, 8 Drawing Sheets

METHOD FOR SURFACE TREATMENT

CROSS-REFERENCE TO RELATED APPLICATION

This application claims priority to Japanese Patent Applications Nos. 2003-339322 filed Sep. 30, 2003 and 2004-171943 filed Jun. 9, 2004, which are hereby expressly incorporated by reference herein in their entirety.

BACKGROUND OF THE INVENTION

1. Field of the Invention

The present invention relates to a method for surface treatment.

2. Description of the Prior Art

In recent years, semiconductor devices, quartz oscillators, and the like are manufactured through processing carried out using photolithography technology or the like, that is, so-called micromachining technology is actively employed. By employing micromachining technology, it is possible to directly process substrates. For example, after one surface of a substrate is subjected to processing, the thickness of the substrate can be reduced or holes can be provided in the substrate by subjecting the other surface of the substrate, which is opposite to the processed surface, to etching or the like.

In such a case where one surface of a substrate is processed (that is, in a case where one surface of a substrate is subjected to etching), there is a necessity to protect the other surface that has been processed (hereinafter, referred to as a "processed surface") from an etchant. From such a viewpoint, an apparatus for etching capable of subjecting only a surface opposite to a processed surface (hereinafter, referred to as a "surface to be etched") to etching while protecting the processed surface has been developed (see Japanese Patent Laid-open No. Hei 7-111257, for example). The apparatus for etching disclosed in Japanese Patent Laid-open No. Hei 7-111257 includes a supporting jig and a pressing jig to be detachably attached to the supporting jig. When the pressing jig is attached to the supporting jig with a substrate being placed on the supporting jig, the pressing jig presses the peripheral portion of the substrate. In this way, the substrate is secured to the apparatus for etching.

Further, the apparatus for etching has O-rings provided at predetermined positions. While the substrate is being secured to the apparatus for etching, the O-rings are in close contact with a surface to be etched of the substrate. This makes it possible to prevent an etchant from being reached to a processed surface of the substrate. Therefore, even when the apparatus for etching to which the substrate is secured is immersed in an etchant, only the surface to be etched is subjected to etching.

However, in the case where such an apparatus for etching is used, the outer peripheral portion of the surface to be etched which is pressed by the pressing jig is not exposed to the etchant so that the outer peripheral portion is not treated.

As a result, a difference in level is developed on the etched surface at the boundary between a portion that has been in contact with the pressing jig (that is, an untreated portion) and a portion that has not been in contact with the pressing jig (that is, a treated portion). Such a difference in level causes a problem that it is difficult to evenly carry out various treatments for each area of the substrate in post-steps coming after etching.

SUMMARY OF THE INVENTION

It is therefore an object of the present invention to provide a method for surface treatment capable of evenly subjecting a substrate to surface treatment.

In order to achieve the above-identified objects, the present invention is directed to a method for surface treatment. The method is used for surface treatment for a substrate using a surface treatment apparatus. The substrate has one surface to which the surface treatment is to be carried out and the other surface opposite to the one surface, and the surface treatment apparatus has at least one enclosed space and a contact portion surrounding the enclosed space adapted to hermetically contact with the other surface of the substrate to produce negative pressure in cooperation with the enclosed space and the other surface of the substrate so that the substrate is attracted onto the surface treatment apparatus by means of the negative pressure to maintain such a state at least during the surface treatment. The method includes:

a first step in which the surface treatment apparatus and the substrate placed thereon in a state where the other surface of the substrate faces the surface treatment apparatus are conveyed to the inside of a decompression chamber to decompress the enclosed space thereby producing the negative pressure in the enclosed space;

a second step in which the surface treatment apparatus and the substrate are brought out from the inside of the decompression chamber to environment under atmospheric pressure in a state where the substrate is being attracted to the surface treatment apparatus with the use of a difference between the negative pressure inside the closed space and atmospheric pressure; and a third step in which the surface treatment is carried out to the one surface of the substrate under the condition that the substrate is being attracted by the surface treatment apparatus.

This makes it possible to evenly subject a substrate to surface treatment.

In the method for surface treatment of the present invention, it is preferable that the pressure within the decompression chamber in the first step is 70,000 Pa or less.

This makes it possible for the substrate to be stuck to and held by the surface treatment apparatus by suction reliably while the substrate is more reliably prevented from being damaged.

In the method for surface treatment of the present invention, it is preferable that the surface treatment in the third step is carried out under atmospheric pressure or higher pressure.

This makes it possible to easily set the pressure inside the decompression chamber in the first step because it is no need to set accurate pressure in the third step.

In the method for surface treatment of the present invention, it is preferable that the method further includes:

a fourth step after the third step, in which the surface treatment apparatus with the substrate is conveyed to the inside of the decompression chamber again, in which the substrate is released from the surface treatment apparatus by decompressing the inside of the decompression chamber so that the pressure within the decompression chamber becomes substantially equal to or lower than the pressure within the decompression chamber in the first step.

This makes it possible to easily release the substrate from the surface treatment apparatus.

In the method for surface treatment of the present invention, it is preferable that, when the pressure within the decompression chamber in the first step is defined as A (Pa) and the pressure within the decompression chamber in the fourth step is defined as B (Pa), the relationship that B/A is 1 or less is satisfied.

This makes it possible to reliably release the substrate from the surface treatment apparatus.

In the method for surface treatment of the present invention, it is preferable that the pressure within the decompression chamber in the fourth step is 70,000 Pa or less.

This makes it possible to more reliably release the substrate from the surface treatment apparatus.

In the method for surface treatment of the present invention, it is preferable that the surface treatment apparatus further includes separation assisting means which assists separation of the substrate from the contact portion of the surface treatment apparatus in the decompression chamber.

This makes it possible to more reliably release the substrate from the surface treatment apparatus.

In the method for surface treatment of the present invention, it is preferable that the separation assisting means includes a contact member having one end portion which is adapted to contact with the other surface of the substrate when the substrate is separated from the contact portion of the surface treatment apparatus, and displacement means for displacing the contact member in a direction in which the contact member is separated from the contact portion.

According to the separation assisting means, it is possible to reliably release the substrate from the surface treatment apparatus even though it has a simple structure.

In the method for surface treatment of the present invention, it is preferable that the contact member has the other end portion opposite to the one end portion thereof, and the contact member can be pivotally rotated with the other end portion being used as a pivotal center.

This makes it possible to simplify the structure of the displacement means.

In the method for surface treatment of the present invention, it is preferable that the displacement means is constituted from any one of a spring, an elastic member having a hollow space in which the volume of the hollow space is increased by decompressing the inside of the decompression chamber, a lever and a weight, and a motor.

This makes it possible to prevent an increase in the number of components of the surface treatment apparatus and an increase in manufacturing costs of the surface treatment apparatus because the displacement means has a very simple structure.

In the method for surface treatment of the present invention, it is preferable that the surface treatment apparatus has a flow path which allows the enclosed space to communicate with the outside thereof with the substrate being contact with the contact portion wherein the flow path is hermetically sealed in the first, second and third steps; and that the method for surface treatment further comprises: a fourth step after the third step, in which the substrate is released from the surface treatment apparatus by opening the flow path.

This makes it possible to easily release the substrate from the surface treatment apparatus.

In the method for surface treatment of the present invention, it is preferable that the substrate has one or more concave portions each opening to the other surface thereof; and that the method for surface treatment further comprises the step of: prior to the first step, providing a sheet-shaped material on the other surface of the substrate so that the concave portions of the substrate can be covered.

This makes it possible to prevent a liquid for treatment from intruding the enclosed spaces of the surface treatment apparatus when the surface treatment such as washing is carried out to the substrate after releasing the substrate from the surface treatment apparatus.

In the method for surface treatment of the present invention, it is preferable that the substrate has one or more concave portions each opening to the other surface thereof; and that the contact portion is constituted so as to be able to cover the concave portions of the substrate with the substrate being contact with the contact portion.

This makes it possible to reliably hold (secure) the substrate having the concave portions to the surface treatment apparatus.

In the method for surface treatment of the present invention, it is preferable that the surface treatment apparatus has a flat-shaped structure having two major surfaces, and has the concave portion on the side of each of the two major surfaces.

This makes it possible to reduce the costs required for the surface treatment and to shorten the time required for the surface treatment.

In the method for surface treatment of the present invention, it is preferable that the surface treatment is carried out using a liquid for treatment.

The method for surface treatment of the present invention can be applied to various types of surface treatment, and in particular, the method can be applied to surface treatment using a liquid for treatment suitably.

In the method for surface treatment of the present invention, it is preferable that the liquid for treatment includes an etchant.

Particularly, the method for surface treatment of the present invention can be applied to wet etching more suitably.

BRIEF DESCRIPTION OF THE DRAWINGS

The above and other objects, features, and the advantages of the invention will readily become more apparent from the following detailed description of preferred embodiments of the invention with reference to the accompanying drawings.

DETAILED DESCRIPTION OF THE INVENTION

Hereinbelow, a method for surface treatment according to the present invention will be described in detail with reference to preferred embodiments shown in the appended drawings.

In the present invention, substrates to be subjected to surface treatment include both of individual substrates and wafers. On one surface of such a substrate (hereinafter, referred to as a "front surface"), which is opposite to the other surface to be subjected to surface treatment (hereinafter, referred to as a "back surface"), semiconductor elements (active elements) or wiring formed of a transparent conductive film or the like may be provided. The method for surface treatment according to the present invention is applied to a case where the back surface of a substrate having such a processed front surface is subjected to surface treatment. Hereinbelow, a description will be made with regard to a case where the back surface of a substrate is subjected to wet etching by way of example.

<First Embodiment>

First, a first embodiment of a surface treatment apparatus to be used in the present invention will be described.

Figure 1:
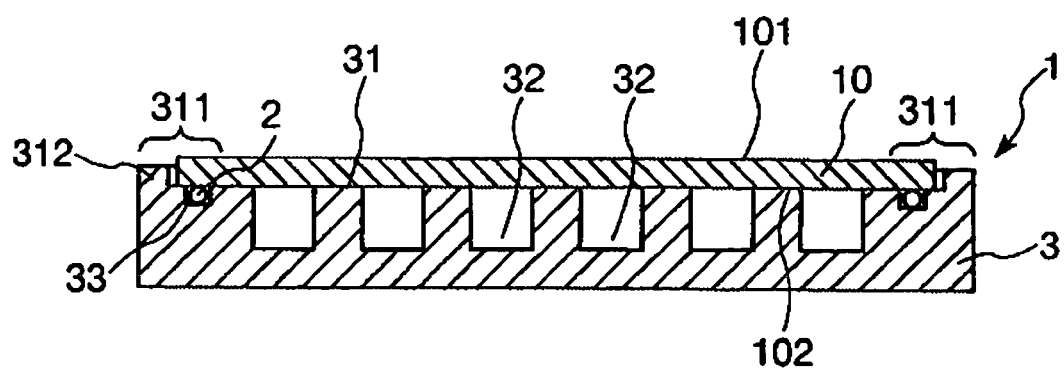
FIG. 1 is a cross-sectional view which shows a surface treatment apparatus in a first embodiment.
Figure 2:
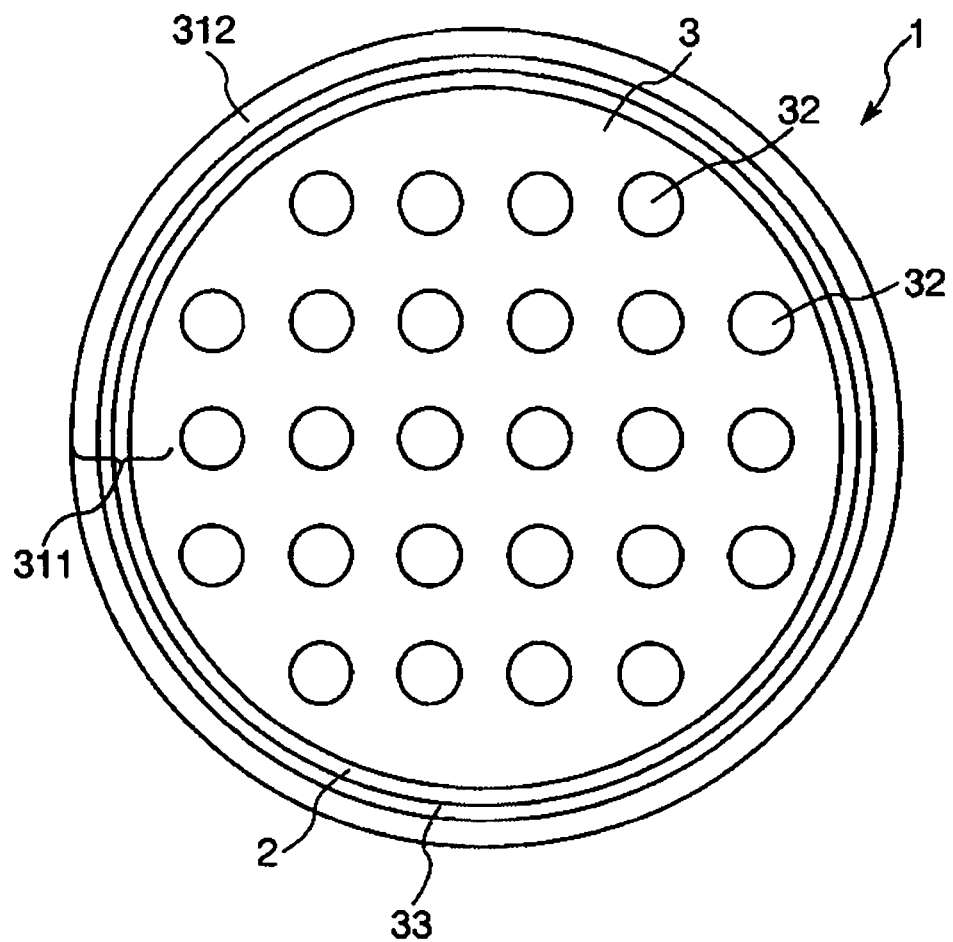
FIG. 2 is a plan view of the surface treatment apparatus shown in FIG. 1.

FIG. 1 is a cross-sectional view which shows the first embodiment of the surface treatment apparatus. FIG. 2 is a plan view of the surface treatment apparatus shown in FIG. 1. In the following description, it is to be noted that the upper side and the lower side in FIG. 1 will be referred to as the "upper side" and the "lower side", respectively.

A surface treatment apparatus 1 of the first embodiment can hold a substrate 10 with the substrate 10 being stuck thereto by suction so that an entire back surface 101 of the substrate 10 (which is one surface of the substrate 10) is exposed to the outside and a front surface 102 of the substrate 10 (which is the other surface of the substrate 10) is protected from the outside.

The surface treatment apparatus 1 shown in FIGS. 1 and 2 includes an O-ring (which is a contact portion) 2 to be brought into contact with the front surface 102 of the substrate 10, and a main body 3 which supports the O-ring 2.

The main body 3 is formed so as to have a disc shape (flat plate shape), and has a substrate contact surface 31. The size of the substrate contact surface 31 when viewed from the top of the surface treatment apparatus 1 is slightly larger than that of the substrate 10 to be held (or to be secured). Further, the main body 3 has a plurality of concave portions 32 provided in an area on the inner side of a peripheral portion 311. Each of the concave portions 32 forms an enclosed space with the front surface 102 of the substrate 10 (that is, the enclosed space is defined by the concave portion 32 and the front surface 102 of the substrate 10). As will be described later, the enclosed spaces are decompressed, and then the surface treatment apparatus 1 is subjected to atmospheric pressure, so that the difference between pressure within the concave portions 32 and atmospheric pressure allows the substrate 10 to be stuck to and held by the surface treatment apparatus 1 by suction.

In the peripheral portion 311 of the main body 3, there is provided an annular groove 33. The groove 33 accommodates the O-ring 2. The O-ring 2 is a member having the function of maintaining the hermeticity of the concave portions (that is, enclosed spaces) 32 while the substrate 10 is being stuck to the surface treatment apparatus 1 by suction. In the present embodiment, by allowing the O-ring 2 and the front surface 102 of the substrate 10 to firmly stick together, the concave portions 32 are hermetically sealed.

The O-ring 2 is mainly made of an elastic material. Examples of such an elastic material include various rubber materials such as natural rubber, butyl rubber, isoprene rubber, butadiene rubber, styrene-butadiene rubber and silicone rubber, and various thermoplastic elastomers such as polyurethane-based thermoplastic elastomer, polyester-based thermoplastic elastomer, polyamide-based thermoplastic elastomer, olefin-based thermoplastic elastomer, and styrene-based thermoplastic elastomer. These elastic materials can be used singly or in combination of two or more of them.

Further, the main body 3 has a step portion 312 provided along the edge portion thereof. The step portion 312 is formed so as to be higher than the substrate contact surface 31, and functions as a positioning guide at the time when the substrate 10 is placed at a predetermined position on the substrate contact surface 31. The main body 3 is mainly made of a hard material. As will be described later, since the substrate 10 is stuck to and held by the surface treatment apparatus 1 by suction due to the difference between pressure within the concave portions 32 and atmospheric pressure (hereinafter, simply referred to as a "pressure difference"), the use of a hard material for the main body 3 makes it possible to suitably prevent the surface treatment apparatus 1 from being deformed while the substrate 10 is being stuck to and held by the surface treatment apparatus 1 by suction.

Examples of such a hard material include various ceramic materials such as various glass, alumina, silica, titania, zirconia, yttria, calciumphosphate, silicon nitride, aluminum nitride, titanium nitride, boron nitride, graphite and tungsten carbide, and various metal materials such as iron, nickel, copper, aluminum, titanium, and alloys containing two or more of them. These hard materials can be used singly or in combination of two or more of them.

Among them, various ceramic materials are preferably used as a constituent material of the main body 3. The use of various ceramic materials as a constituent material of the main body 3 makes it possible to impart high mechanical strength and high resistance to etchants (which are liquids for treatment) to the main body 3. From the viewpoint of improving resistance to etchants, the surface of the main body 3 may be coated with a material having high chemical resistance such as fluorine-based resins, for example.

The ratio of the total opening area of the concave portions 32 with respect to the area of the substrate 10 when viewed from the top of the surface treatment apparatus 1 is preferably in the range of about 1/20 to 3/4, and more preferably it is in the range of about 1/4 to 1/2. By setting the ratio to a value within the above range, it is possible for the substrate 10 to be stuck to and held by the surface treatment apparatus 1 by suction more reliably due to the pressure difference. If the total opening area of the concave portions 32 is too large, there is a fear that the mechanical strength of the main body 3 is extremely lowered depending on the depth of the concave portions 32 or the constituent material of the main body 3.

The concave portions 32 are decompressed with the concave portions 32 being covered with the substrate 10, and then the surface treatment apparatus 1 is subjected to atmospheric pressure. As a result, force pressing the substrate 10 toward the substrate contact surface 31 is generated due to the pressure difference so that the substrate 10 is pressed against the substrate contact surface 31. In this way, the substrate 10 is stuck to and held by the surface treatment apparatus 1 by suction. At this time, the O-ring 2 is deformed so that repulsive force is generated in the up-and-down direction. As a result, the gap between the substrate 10 and the O-ring 2 is hermetically sealed (that is, the gap is closed), which makes it possible to keep the insides of the concave portions 32 in a reduced pressure (decompressed) state.

Particularly, by providing the plurality of concave portions 32 so as to be scattered, it is possible to secure the substrate 10 to the surface treatment apparatus 1 evenly. Unlike a conventional apparatus which allows a substrate to be secured by holding it between jigs, since the surface treatment apparatus 1 secures the substrate 10 by creating a negative pressure in the concave portions 32, the entire back surface (which is a surface to be subjected to surface treatment) 101 of the substrate 10 can be exposed to the outside.

Therefore, it is possible to evenly subject each area of the back surface 101 of the substrate 10 to wet etching. In addition, since the gap between the front surface 102 of the substrate 10 and the main body 3 is hermetically sealed by the O-ring 2, the front surface 102 of the substrate 10 can be reliably protected from an etchant (which is a liquid for treatment) upon wet etching of the substrate 10. In order to hermetically seal the gap between the front surface 102 of the substrate 10 and the main body 3 with the use of the O-ring 2 as described above, the wire diameter L and the Shore hardness Hs of the O-ring 2 are preferably set so as to satisfy the following conditions. First, the repulsive force F of the O-ring 2 can be determined from the following formula (I):

$$F/L = 4.58 \times 10^{-7} \epsilon^{1.8} Hs^{4.0} \text{(kg/cm)} \quad \text{(I)}$$

where F is repulsive force (kg), L is a wire diameter (that is, a diameter) (cm), $\epsilon$ is a squeeze ratio, and Hs is Shore hardness.

Here, the squeeze ratio $\epsilon$ means the ratio of amount of squeeze of the O-ring 2 with respect to the wire diameter L of the O-ring 2 at the time when the O-ring 2 is squeezed. For example, in a case where the O-ring 2 having a wire diameter L of 1 mm is squeezed so that the amount of squeeze becomes 0.2 mm, the squeeze ratio $\epsilon$ at this time is expressed by 0.2/1.

Therefore, it is preferred that the wire diameter L and the Shore hardness Hs of the O-ring 2 are set so that the repulsive force F determined from the formula (I) becomes smaller than force pressing the substrate 10 generated due to the pressure difference (hereinafter, referred to as a "condition A"). By setting the wire diameter L and the Shore hardness Hs of the O-ring 2 so that the condition A can be satisfied, the O-ring 2, the front surface 102 of the substrate 10, and the main body 3 can stick together more firmly, thereby enabling the substrate 10 to be stuck to and held by the surface treatment apparatus 1 by suction more reliably.

Further, average pressure P generated by the repulsive force of the O-ring 2 can be determined from the following formula (II):

$$P = F/S \text{(kg/cm}^2\text{)} \quad \text{(II)}$$

where P is average pressure (kg/cm$^2$), F is repulsive force (kg), and S is the area of the groove 33 when viewed from the top of the surface treatment apparatus 1 (cm$^2$).

Therefore, it is preferred that the wire diameter L and the Shore hardness Hs of the O-ring 2 are set so that the average pressure P determined from the formula (II) becomes higher than the water pressure of an etchant to be used in wet etching (especially, so that the average pressure P becomes about 1.5 to 3.5 times as high as the water pressure of an etchant to be used in wet etching) (hereinafter, referred to as a "condition B"). By setting the wire diameter L and the Shore hardness Hs of the O-ring 2 so that the condition B can be satisfied, it is possible to more reliably prevent the O-ring 2 from being deformed due to the water pressure of the etchant so that intrusion of the etchant into the concave portions 32 is prevented.

In this regard, it should be noted that it is more preferred that the wire diameter L and the Shore hardness Hs of the O-ring 2 are set so that both of the conditions A and B can be satisfied. By setting the wire diameter L and the Shore hardness Hs of the O-ring 2 so that both of the conditions A and B can be satisfied, it is possible for the substrate 10 to be stuck to and held by the surface treatment apparatus 1 by suction more reliably as well as it is possible to prevent an etchant from intruding the concave portions 32 more reliably.

Next, a method of subjecting a substrate to surface treatment with the use of the surface treatment apparatus 1 of the first embodiment (that is, a first method for surface treatment) will be described.

<1A> Decompression Step (First Step)

First, the substrate 10 is brought into contact with the surface treatment apparatus 1 shown in FIGS. 1 and 2 so that the front surface 102 of the substrate 10 can come into contact with the O-ring 2 and so that the substrate 10 can be placed on the inner side of the step portion 312.

In the case where the front surface 102 of the substrate 10 has been already processed, that is, in the case where wiring, semiconductor elements (active elements) or the like have been already provided on the front surface 102 of the substrate 10, a protective layer may be formed on the front surface 102 of the substrate 10 prior to the step <1A>. By forming the protective layer on the front surface 102 of the substrate 10, it is possible to prevent such wiring or semiconductor elements provided on the front surface 102 of the substrate 10 from being damaged when coming into contact with (abutting on) the substrate contact surface 31. The protective layer can be formed (or provided) by application of a resist, attachment of a polymeric sheet, or the like. The average thickness of the protective layer is preferably in the range of about 1 to 50 μm, and more preferably in the range of about 5 to 30 μm.

Next, the surface treatment apparatus 1 which is in contact with the substrate 10 is conveyed to the inside of a vacuum chamber (decompression chamber), and then the vacuum chamber is decompressed. Air within the concave portions 32 escapes (leaks out) little by little through the gap between the substrate 10 and the O-ring 2 so that the pressure within the concave portions 32 becomes substantially equal to the pressure within the vacuum chamber. At this time, the pressure within the vacuum chamber is preferably 70,000 Pa or less, and more preferably in the range of about 60,000 to 50,000 Pa. By setting the pressure within the vacuum chamber to a value within the above range, it is possible for the substrate 10 to be stuck to and held by the surface treatment apparatus 1 by suction while the substrate 10 is more reliably prevented from being damaged in the next step <2A>.

<2A> Step in which the Substrate is Stuck to and Held by the Surface Treatment Apparatus by Suction (Second Step)

Next, decompression of the vacuum chamber is terminated, and the pressure within the vacuum chamber is returned to atmospheric pressure. As a result, a pressure difference is generated between the pressure within the concave portions 32 and the external pressure (that is, atmospheric pressure), and pressing force is exerted on the substrate 10 toward the substrate contact surface 31 so that the substrate 10 is pressed against the substrate contact surface 31 (that is, the substrate 10 is stuck to the surface treatment apparatus 1 by suction) and is held by the surface treatment apparatus 1.

At this time, the O-ring 2 is squeezed in the up-and-down direction so that repulsive force is generated in the up-and-down direction. As a result, the gap between the substrate 10 and the O-ring 2 is hermetically sealed, which makes it possible to reliably keep the insides of the concave portions 32 in a reduced pressure (decompression) state.

In this regard, the steps described above can be carried out by controlling the pressure within the vacuum chamber. However, since a reduced pressure state within the concave portions 32 of the surface treatment apparatus 1 depends on the size of the gap between the O-ring 2 and the front surface 102 of the substrate 10 and the size of the gap between the O-ring 2 and the main body 3, a mechanism capable of adjusting the sizes of the gaps when the surface treatment apparatus 1 is conveyed to the vacuum chamber may be provided in the vacuum chamber.

<3A> Etching Step (Third Step)

Next, the surface treatment apparatus 1 by which the substrate 10 is held by suction is immersed in a desired etchant (which is a liquid for treatment) stored in a bath to subject the back surface 101 of the substrate 10 to surface treatment. An etchant to be used is not limited to any specific one, and is appropriately selected according to a purpose. Examples of such an etchant include an aqueous hydrofluoric acid solution, an aqueous hydrogen peroxide solution, an aqueous ammonium bifluoride solution, an aqueous potassium hydroxide solution, and TMH (tetramethyl ammonium hydroxide), and they can be used singly or in combination of two or more of them.

In wet etching, it is preferred that the substrate 10 is subjected to surface treatment while the surface treatment apparatus 1 is rotated. By doing so, it is possible to subject each area of the back surface 101 to surface treatment evenly. As described above, the surface treatment apparatus 1 of the present embodiment allows the substrate 10 to be held (secured) thereto due to the pressure difference, but the surface treatment apparatus 1 does not have a flow path which allows the concave portions 32 to communicate with the outside with the substrate 10 being in contact with the O-ring 2 (or with the substrate 10 being firmly stuck to the O-ring 2). That is, in the present embodiment, there is no necessity to connect a suction tube for decompressing the concave portions 32 to the surface treatment apparatus 1, and therefore there is no possibility that suction tubes intertwine with each other when the surface treatment apparatuses 1 are rotated upon wet etching. Namely, the surface treatment apparatus 1 is easy to handle.

From such a viewpoint, such a surface treatment apparatus is suitably used in subjecting a substrate to wet etching. In the present embodiment, it is to be noted that pressure at the time when surface treatment is carried out is higher than atmospheric pressure (atmospheric pressure or higher), because the substrate 10 is subjected to surface treatment with the surface treatment apparatus 1 being immersed in an etchant so that water pressure is further applied. Pressure at the time when the step <3A> is carried out varies depending on the type of surface treatment, but this pressure is preferably atmospheric pressure or higher. Therefore, in the present embodiment, since it is not necessary to precisely set pressure at the time when the step <3A> is carried out, pressure within the vacuum chamber in the step <1A> is easily set.

<4A> Step of Releasing the Substrate (Fourth Step)

Next, the surface treatment apparatus 1 is taken out of the bath, and is then conveyed to the vacuum chamber (decompression chamber) again. The vacuum chamber is decompressed so that pressure within the vacuum chamber becomes substantially equal to or lower than the pressure within the vacuum chamber in the step <1A>. By doing so, pressure within the concave portions 32 becomes substantially equal to or higher than the external pressure (that is, the pressure within the concave portions 32 becomes substantially equal to or higher than the pressure within the vacuum chamber). As a result, pressing force is exerted on the substrate 10 in the direction in which the substrate 10 is separated from the substrate contact surface 31 (that is, in the upward direction in FIG. 1) due to the pressure difference so that the substrate 10 is detached from the substrate contact surface 31. That is, the substrate 10 is released (removed) from the surface treatment apparatus 1.

Here, when the pressure within the vacuum chamber in the step <1A> is defined as A (Pa) and the pressure within the vacuum chamber in the step <4A> is defined as B (Pa), it is preferable that the relationship that B/A is 1 or less is satisfied, and more preferably it is 0.8 or less. If B/A exceeds the above range, there is a fear that the pressing force exerted on the substrate 10 is so small that it becomes difficult to release the substrate 10 from the surface treatment apparatus 1. Specifically, the pressure within the vacuum chamber in the step <4A> (that is, B) is preferably 70,000 Pa or less, and more preferably it is in the range of about 30,000 to 20,000 Pa. By setting the pressure within the vacuum chamber in the step <4A> (that is, B) to a value within the above range, it is possible to more reliably release the substrate 10 from the surface treatment apparatus 1.

In the step <4A>, it is to be noted that external force may be applied to the substrate 10 to assist the detachment of the substrate 10 from the surface treatment apparatus 1. Examples of a method of applying such external force include a method where the outer peripheral portion (edge portion) of the substrate 10 is pressed in the direction in which the substrate 10 is separated from the substrate contact surface 31 (that is, in the upward direction in FIG. 1) with the use of a pin (which will be described later in fifth to eighth embodiments), a method in which a magnetic field is applied to a magnet attached to the main body 3 in advance so as to act as repulsive force, and the like.

According to such a method for surface treatment, since the back surface 101 of the substrate 10 is evenly subjected to etching (surface treatment), it is possible to accurately carry out operations such as application of a resist, exposure using a contact aligner, and the like in post-steps coming after the step <4A>.

<Second Embodiment>

Next, a second embodiment of the surface treatment apparatus to be used in the present invention will be described.

Figure 3:
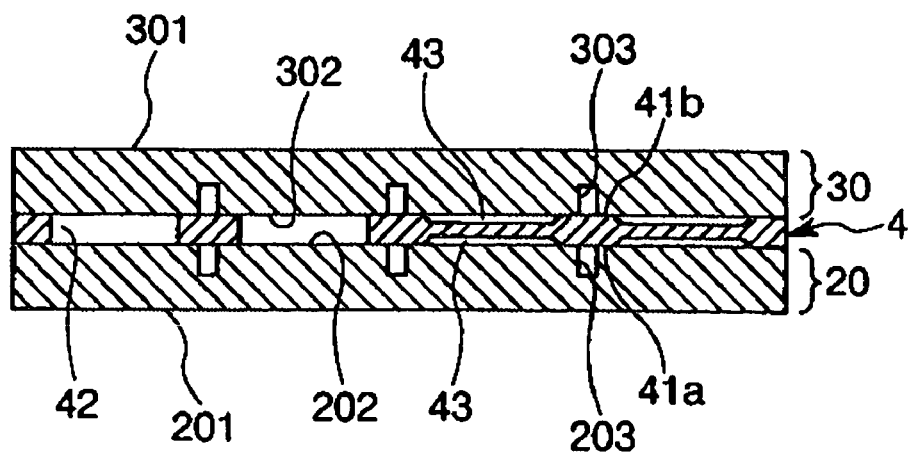
FIG. 3 is a cross-sectional view which shows a surface treatment apparatus in a second embodiment.
Figure 4:
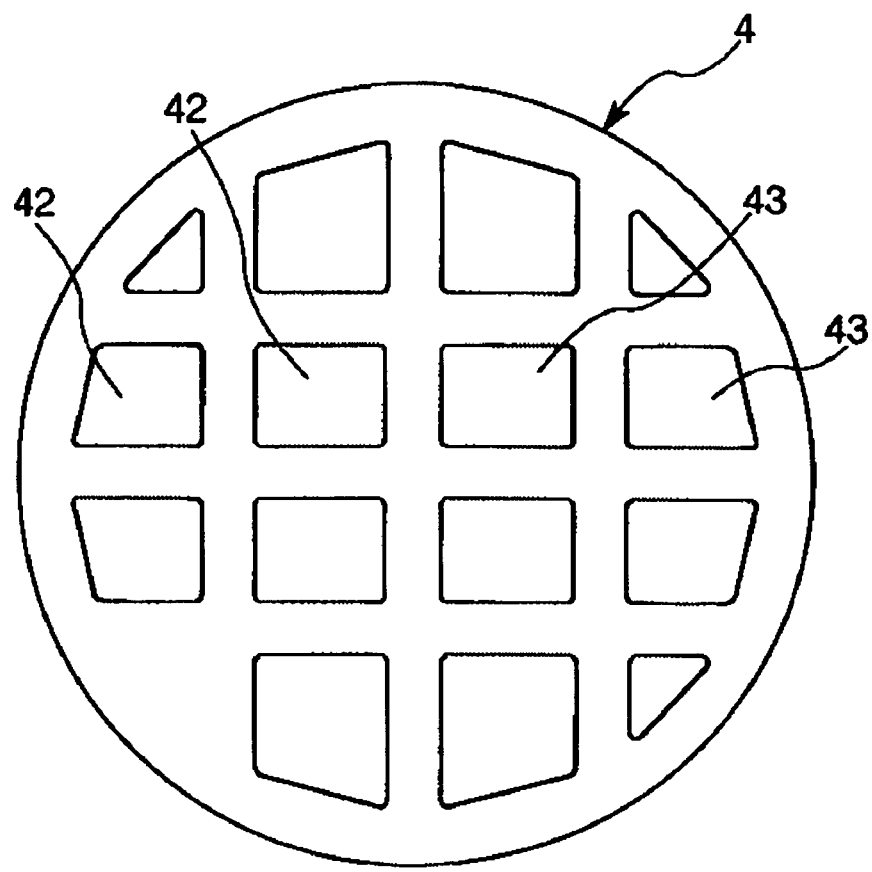
FIG. 4 is a plan view of the surface treatment apparatus shown in FIG. 3.

FIG. 3 is a cross-sectional view which shows the second embodiment of the surface treatment apparatus, and FIG. 4 is a plan view of the surface treatment apparatus shown in FIG. 3. In the following description, it is to be noted that the upper side and the lower side in FIG. 3 will be referred to as the "upper side" and the "lower side", respectively.

Hereinbelow, the second embodiment of the surface treatment apparatus will be described by focusing the difference between the first and second embodiments, and a description with regard to the overlapping points will be omitted.

A surface treatment apparatus 4 of the second embodiment is constituted from a flat-shaped member having two major surfaces, and has a contact portion on each of the two surfaces thereof to which a substrate is stuck by suction. That is, the surface treatment apparatus 4 shown in FIGS. 3 and 4 can hold substrates 20 and 30 with the substrates 20 and 30 being stuck thereto by suction so that entire back surfaces 201 and 301 of the substrates 20 and 30 are exposed to the outside and front surfaces 202 and 302 of the substrates 20 and 30 are protected from the outside.

The surface treatment apparatus 4 is formed so as to have a disc shape (flat plate shape), and has substrate contact surfaces 41*a* and 41*b*. The sizes of the substrate contact surfaces 41*a* and 41*b* when viewed from the top of the surface treatment apparatus 4 are substantially equal to the sizes of the substrates 20 and 30 to be held (or to be secured), respectively. In the present embodiment, the almost entire surface treatment apparatus 4 is mainly made of an elastic material. As such an elastic material, the same elastic materials as those mentioned above with reference to the first embodiment can be used.

Further, the surface treatment apparatus 4 has a plurality of through holes 42 and a plurality of concave portions 43. The through holes 42 pass through the surface treatment apparatus 4 in the thickness direction thereof, and the concave portions 43 are provided in the substrate contact surface 41*a* on the lower side of the surface treatment apparatus 4 and in the substrate contact surface 41*b* on the upper side of the surface treatment apparatus 4. Each of the through holes 42 forms (defines) an enclosed space together with the front surface 202 of the substrate 20 and the front surface 302 of the substrate 30. Each of the concave portions 43 forms (defines) an enclosed space together with the front surface 202 of the substrate 20 or together with the front surface 302 of the substrate 30. As will be described later, the enclosed spaces are decompressed, and then the surface treatment apparatus 4 is subjected to atmospheric pressure, so that the difference between pressure within the through holes 42 and the concave portions 43 and atmospheric pressure (hereinafter, simply referred to as the "pressure difference") allows the substrates 20 and 30 to be stuck to and held by the surface treatment apparatus 4 by suction.

In the present embodiment, some of the enclosed spaces to be decompressed are formed from the concave portions 43, which makes it possible to prevent lowering of the mechanical strength of the surface treatment apparatus 4 compared with a case where all of the enclosed spaces are formed from the through holes 42. According to such a structure, it is possible to increase the number of substrates to be subjected to surface treatment while reducing the number of components of the surface treatment apparatus 4. As a result, costs and time to be spent on etching (surface treatment) can be reduced.

The through holes 42 and the concave portions 43 are decompressed with the through holes 42 and the concave portions 43 being covered with the substrates 20 and 30, and then the surface treatment apparatus 4 is subjected to atmospheric pressure. As a result, force pressing the substrate 20 toward the substrate contact surfaces 41*a* and force pressing the substrate 30 toward the substrate contact surface 41*b* are generated due to the pressure difference so that the substrates 20 and 30 are pressed against the substrate contact surfaces 41*a* and 41*b*, respectively. In this way, the substrates 20 and 30 can be stuck to and held by the surface treatment apparatus 4 by suction.

At this time, the surface treatment apparatus 4 is compressed in the up-and-down direction so that repulsive force is generated in the up-and-down direction. As a result, the gap between the substrate 20 and the substrate contact surface 41*a* and the gap between the substrate 30 and the substrate contact surface 41*b* are hermetically sealed (that is, the gaps are closed), which makes it possible to keep the insides of the through holes 42 and the concave portions 43 in a reduced pressure state. As shown in FIG. 3, the substrates 20 and 30 have concave portions 203 and 303 having openings in the front surfaces 202 and 302, respectively. The surface treatment apparatus 4 is formed so as to have a structure capable of covering the openings of the concave portions 203 and 303 when the substrates 20 and 30 are brought into contact with the surface treatment apparatus 4, which makes it possible to reliably keep the insides of the through holes 42 and the concave portions 43 in a reduced pressure state. Therefore, the surface treatment apparatus 4 can hold the substrates 20 and 30 with stability even when the front surfaces of the substrates 20 and 30 have a complicate structure containing the concave portions 203 and 303.

As for substrates having such concave portions, a multi-layer semiconductor substrate having through holes as concave portions, an ink-jet head substrate having ink chambers as concave portions, and an electrostatic microphone having back air chambers as concave portions can be mentioned, for example. The surface treatment apparatus 4 of the second embodiment will provide the same effects as those described above with reference to the surface treatment apparatus 1 of the first embodiment.

Next, a method of subjecting a substrate to surface treatment with the use of the surface treatment apparatus 4 of the second embodiment (that is, a second method for surface treatment) will be described. It is to be noted that the second method for surface treatment will be described by focusing the difference between the first and second methods, and a description with regard to the overlapping points will be omitted.

<1B> Decompression Step (First Step)

First, the substrates 20 and 30 are brought into contact with the surface treatment apparatus 4 shown in FIGS. 3 and 4.

Specifically, the substrate 20 is brought into contact with the surface treatment apparatus 4 so that the front surface 202 of the substrate 20 can come into contact with the substrate contact surface 41*a* and so that the front surface 202 can be superposed on the substrate contact surface 41*a*. Similarly, the substrate 30 is also brought into contact with the surface treatment apparatus 4 so that the front surface 302 of the substrate 30 can come into contact with the substrate contact surface 41*b* and so that the front surface 302 can be superposed on the substrate contact surface 41*b*. Further, at this time, the substrates 20 and 30 are brought into contact with the surface treatment apparatus 4 so that the openings of the concave portions 203 and 303 can be covered with the substrate contact surfaces 41*a* and 41*b*, respectively.

In this regard, it is to be noted that a sheet-shaped material may be attached to (or provided on) each of the front surface 202 of the substrate 20 and the front surface 302 of the substrate 30 to cover the concave portions 203 and 303 prior to the step <1B>. This makes it possible to prevent washing fluid from intruding into the concave portions 203 and 303 even when the substrates 20 and 30 are washed for the purpose of removing an etchant (which is a liquid for treatment) after the substrates 20 and 30 are released from the surface treatment apparatus 4.

Next, the surface treatment apparatus 4 which is in contact with the substrates 20 and 30 is conveyed to a vacuum chamber (decompression chamber), and then the vacuum chamber is decompressed. As a result, air within the through holes 42 and the concave portions 43 leaks out little by little through the gap between the substrate 20 and the substrate contact surface 41a and the gap between the substrate 30 and the substrate contact surface 41b so that the pressure within the through holes 42 and the concave portions 43 becomes substantially equal to the pressure within the vacuum chamber. In this regard, it is to be noted that a preferred range of the pressure within the vacuum chamber is the same as that described above with reference to the first method for surface treatment.

<2B> Step in which the Substrate is Stuck to and Held by the Surface Treatment Apparatus by Suction (Second Step)

Next, the same step as the step <2A> described above is carried out.

<3B> Etching Step (Third Step)

Next, the same step as the step <3A> described above is carried out.

<4B> Step of Releasing the Substrate (Fourth Step)

Next, the same step as the step <4A> described above is carried out.

<Third Embodiment>

Figure 5:
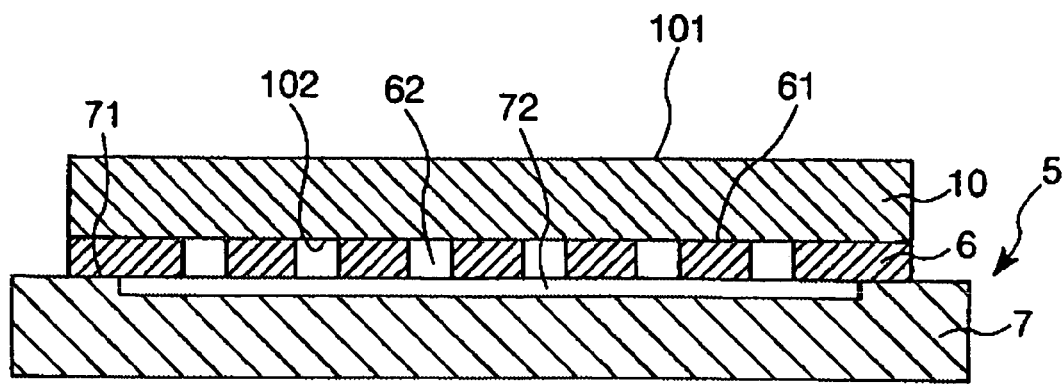
FIG. 5 is a cross-sectional view which shows a surface treatment apparatus in a third embodiment.
Figure 6:
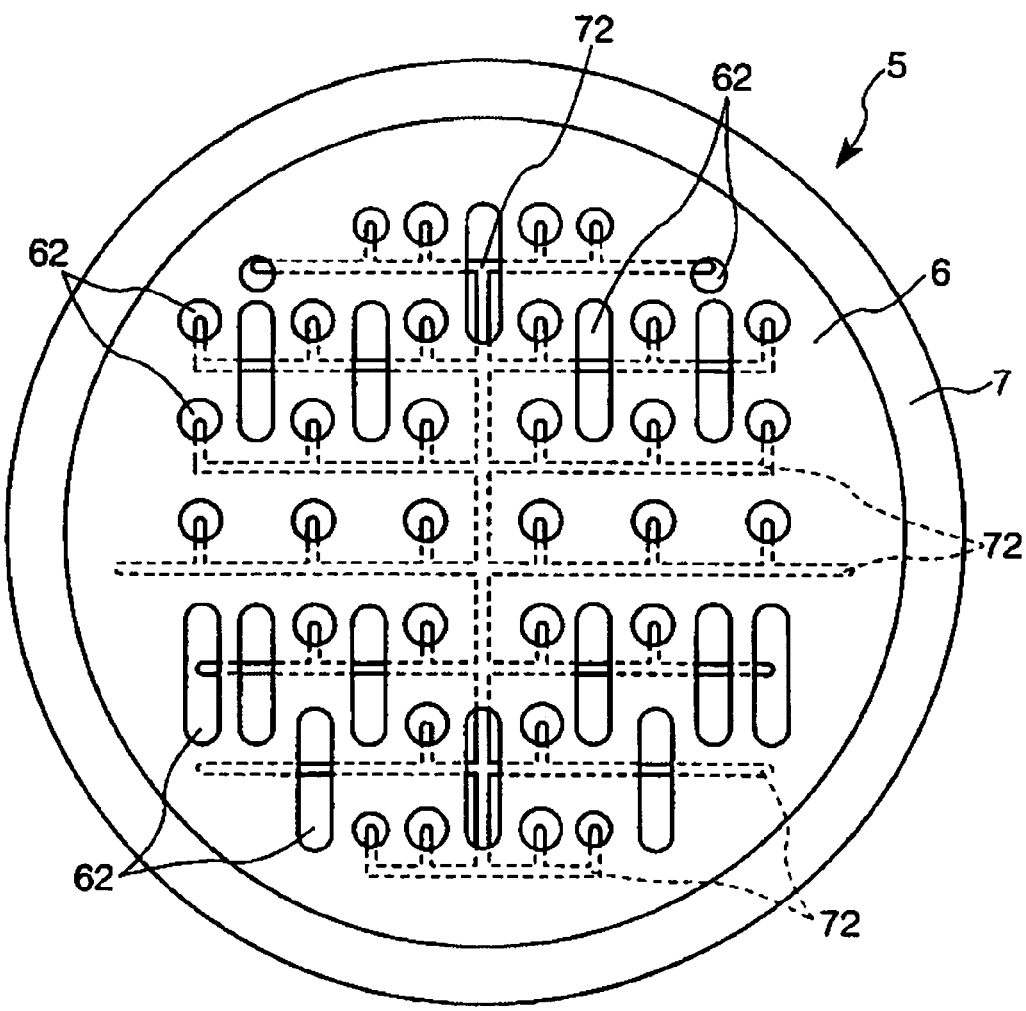
FIG. 6 is a plan view of the surface treatment apparatus shown in FIG. 5.

Next, a third embodiment of the surface treatment apparatus to be used in the present invention will be described. FIG. 5 is a cross-sectional view which shows the third embodiment of the surface treatment apparatus. FIG. 6 is a plan view of the surface treatment apparatus shown in FIG. 5. In the following description, it is to be noted that the upper side and the lower side in FIG. 5 will be referred to as the "upper side" and the "lower side", respectively.

Hereinbelow, the surface treatment apparatus of the third embodiment will be described by focusing the difference between the surface treatment apparatuses of the first and third embodiments, and a description with regard to the overlapping points will be omitted.

A main difference between the first and third embodiments is in the structure of the contact portion, and other structures of the third embodiment are the same as those of the first embodiment. Specifically, a surface treatment apparatus 5 shown in FIGS. 5 and 6 has an elastic plate 6 having a disc shape as the contact portion. The elastic plate 6 is provided on a main body 7.

The elastic plate 6 has a substrate contact surface 61. The size of the substrate contact surface 61 when viewed from the top of the surface treatment apparatus 5 is substantially equal to the size of the substrate 10 to be held (or to be secured). The elastic plate 6 may be mainly made of an elastic material. Examples of such an elastic material include the same elastic materials as those mentioned above with reference to the first embodiment.

Further, the elastic plate 6 has a plurality of through holes (spaces) 62 passing through the elastic plate 6 in the thickness direction thereof. Each of the through holes 62 forms an enclosed space with the front surface 102 of the substrate 10. As will be described later, the enclosed spaces are decompressed, and then the surface treatment apparatus 5 is subjected to atmospheric pressure, so that the difference between the pressure within the through holes 62 and atmospheric pressure (hereinafter, simply referred to as a "pressure difference") allows the substrate 10 to be stuck to and held by the surface treatment apparatus 5 by suction.

Such an elastic plate 6 is supported by the main body 7. The main body 7 has a flow path 72 which allows the through holes 62 to communicate with each other. The flow path 72 is formed so as to have a pattern shown in FIG. 6.

The through holes 62 are decompressed while the through holes 62 are covered with the substrate 10, and then the surface treatment apparatus 5 is subjected to atmospheric pressure. As a result, force pressing the substrate 10 toward the substrate contact surface 61 is generated due to the pressure difference so that the substrate 10 is pressed against the substrate contact surface 61. In this way, the substrate 10 is stuck to and held by the surface treatment apparatus 5 by suction. Particularly, in the present embodiment, since the flow path 72 which allows the through holes 62 to communicate with each other is provided, air can be moved among the through holes 62 so that the pressure within each of the through holes 62 becomes substantially even. This makes it possible for the surface treatment apparatus 5 to secure (or hold) the substrate 10 more stably.

Further, at this time, the elastic plate 6 is compressed in the up-and-down direction in FIG. 5 so that repulsive force is generated in the up-and-down direction. As a result, the gap between the substrate 10 and the substrate contact surface 61 is hermetically sealed (that is, the gap is closed), which makes it possible to keep the insides of the through holes 62 in a reduced pressure state. The surface treatment apparatus 5 of the third embodiment will provide the same effects as those described above with reference to the surface treatment apparatus 1 of the first embodiment.

Next, a method of subjecting a substrate to surface treatment with the use of the surface treatment apparatus of the third embodiment (that is, a third method for surface treatment) will be described. In this regard, it is to be noted that the third method for surface treatment will be described by focusing the difference between the first and third methods, and a description with regard to the overlapping points will be omitted.

<1C> Decompression Step (First Step)

First, the substrate 10 is brought into contact with the surface treatment apparatus 5 shown in FIGS. 5 and 6 so that the front surface 102 of the substrate 10 can come into contact with the substrate contact surface 61 and so that the front surface 102 can be superposed on the substrate contact surface 61.

Next, the surface treatment apparatus 5 which is in contact with the substrate 10 is conveyed to a vacuum chamber (decompression chamber), and then the vacuum chamber is decompressed. As a result, air within the through holes 62 and the flow path 72 leaks out little by little through the gap between the substrate 10 and the substrate contact surface 61 so that the pressure within the through holes 62 becomes substantially equal to the pressure within the vacuum chamber. Further, at this time, since air within each of the through holes 62 evenly leaks out by virtue of the flow path 72, the pressure within each of the through holes 62 becomes substantially even. In this regard, it is to be noted that a preferred range of the pressure within the vacuum chamber is the same as that described above with reference to the first method for surface treatment.

<2C> Step in which the Substrate is Stuck to and Held by the Surface Treatment Apparatus by Suction (Second Step)

Next, the same step as the step <2A> described above is carried out.

<3C> Etching Step (Third Step)

Next, the same step as the step <3A> described above is carried out.

<4C> Step of Releasing the Substrate (Fourth Step)

Next, the same step as the step <4A> described above is carried out.

<Fourth Embodiment>

Figure 7:
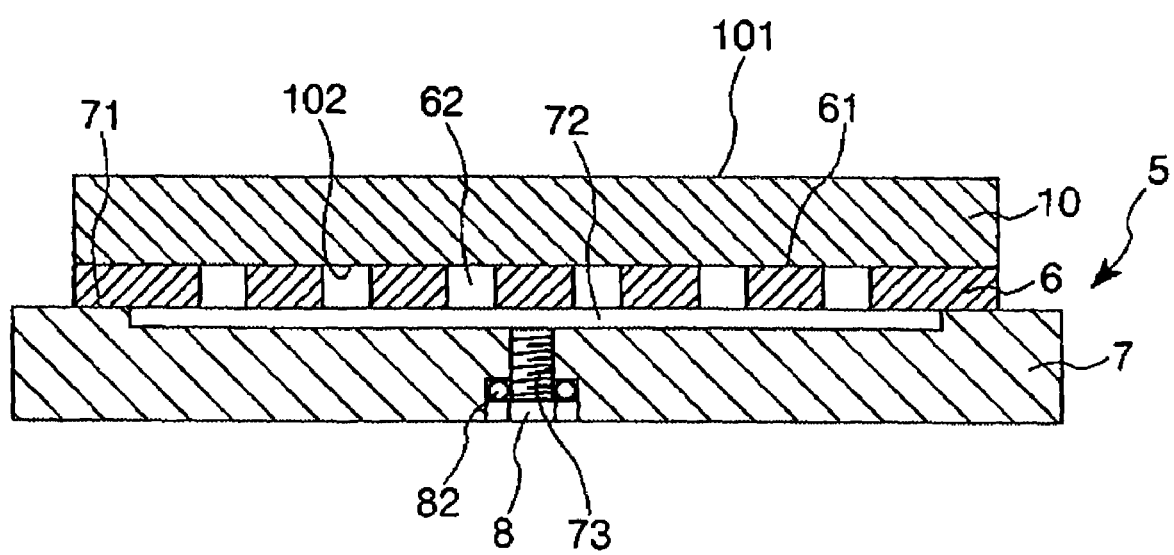
FIG. 7 is a cross-sectional view which shows a surface treatment apparatus in a fourth embodiment.

Next, a fourth embodiment of the surface treatment apparatus to be used in the present invention will be described. FIG. 7 is a cross-sectional view which shows the fourth embodiment of the surface treatment apparatus. In the following description, it is to be noted that the upper side and the lower side in FIG. 7 will be referred to as the "upper side" and the "lower side", respectively. Hereinbelow, the fourth embodiment of the surface treatment apparatus will be described by focusing the differences between the first and third embodiments and the fourth embodiment, and a description with regard to the overlapping points will be omitted.

The surface treatment apparatus of the fourth embodiment is the same as the surface treatment apparatus of the third embodiment except that the surface treatment apparatus of the fourth embodiment has a flow path which allows spaces, which are to be decompressed, to communicate with the outside while a substrate is in contact with the contact portion (or while a substrate is firmly stuck to the contact portion). Specifically, the surface treatment apparatus 5 shown in FIG. 7 has a flow path 73 provided at almost the center of the main body 7. The flow path 73 communicates with both of the flow path 72 and the outside. That is, each of the through holes 62 communicates with the outside of the surface treatment apparatus 5 through the flow paths 72 and 73 while the substrate 10 is in contact with the substrate contact surface 61 (that is, while the substrate 10 is in contact with the elastic plate 6).

In the inner circumferential surface of the flow path 73, there is provided a thread groove so that a screw 81 (which is a sealing member) can be threadedly engaged in the flow path 73. Further, an O-ring 82 having elasticity is provided so as to be positioned between the screw 81 and the main body 7 when the screw 81 is attached to the main body 7. By providing the O-ring 82, it is possible to hermetically seal the flow path 73 when the screw 81 is attached to the flow path 73.

As will be described later, the through holes 62 are decompressed with the through holes 62 being covered with the substrate 10 and the screw 81 being attached to the flow path 73, and then the surface treatment apparatus 5 is subjected to atmospheric pressure. As a result, force pressing the substrate 10 toward the substrate contact surface 61 is generated due to the pressure difference so that the substrate 10 is pressed against the substrate contact surface 61. In this way, the substrate 10 is stuck to and held by the surface treatment apparatus 5 by suction. Then, when the screw 81 is removed from the flow path 73, air flows into the flow path 72 and the through holes 62 through the flow path 73 so that the pressure within the through holes 62 and the flow path 72 becomes substantially equal to the pressure outside the surface treatment apparatus 5. Therefore, the pressing force that has been exerted on the substrate 10 is eliminated, and then the substrate 10 is detached from the substrate contact surface 61.

As described above, according to the surface treatment apparatus 5 of the present embodiment, by removing the screw 81 from the flow path 73 after the substrate 10 is subjected to etching, it is possible to easily release the substrate 10 from the surface treatment apparatus 5. The surface treatment apparatus 5 of the fourth embodiment will provide the same effects as those described above with reference to the surface treatment apparatuses 1 and 5 of the first and third embodiments.

Next, a method of subjecting a substrate to surface treatment with the use of the surface treatment apparatus of the fourth embodiment (that is, a fourth method for surface treatment) will be described. In this regard, it is to be noted that the fourth method for surface treatment will be described by focusing the difference between the third and fourth methods, and a description with regard to the overlapping points will be omitted.

<1D> Decompression Step (First Step)

First, the screw 81 is attached to the flow path 73 of the surface treatment apparatus 5 shown in FIG. 7 to hermetically seal the flow path 73. Subsequently, the same step as the step <1C> described above is carried out.

<2D> Step in which the Substrate is Stuck to and Held by the Surface Treatment Apparatus by Suction (Second Step)

Next, the same step as the step <2C> described above is carried out.

<3D> Etching Step (Third Step)

Next, the same step as the step <3C> described above is carried out.

<4D> Step of Releasing the Substrate (Fourth Step)

Next, the screw 81 is removed from the flow path 73 under, for example, atmospheric pressure to open the flow path 73 to the outside. As a result, air flows into the flow path 72 and the through holes 62 through the flow path 73 so that the pressure within the through holes 62 and the flow path 72 is returned to atmospheric pressure (that is, so that the pressure within the through holes 62 and the flow path 72 becomes substantially equal to the pressure outside the surface treatment apparatus 5). Therefore, the pressing force that has been exerted on the substrate 10 (that is, a load that has been applied on the substrate 10) is eliminated, and then the substrate 10 is detached from the substrate contact surface 61.

<Fifth Embodiment>

Figure 8A:
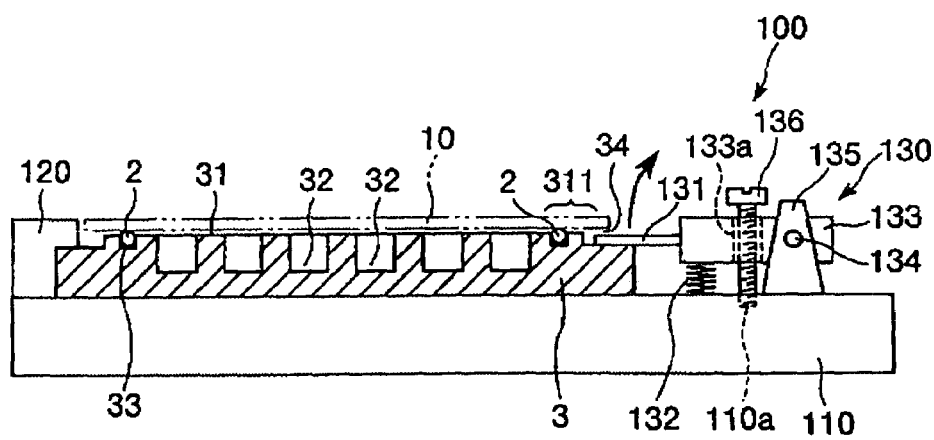
FIGS. 8A and 8B are partially cross-sectional views which show a surface treatment apparatus in a fifth embodiment.
Figure 8B:
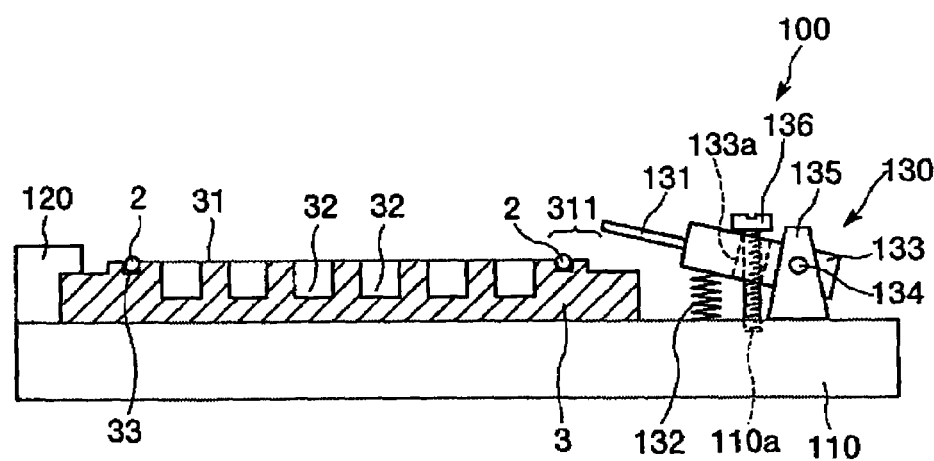
Figure 9A:
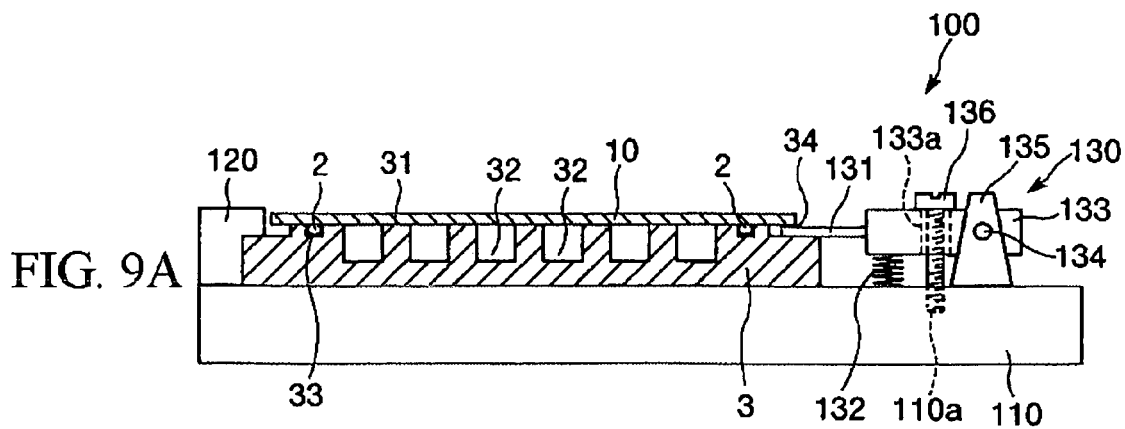
FIGS. 9A–9C are partially cross-sectional views to be used for explaining the usage of the surface treatment apparatus shown in FIGS. 8A and 8B.
Figure 9B:
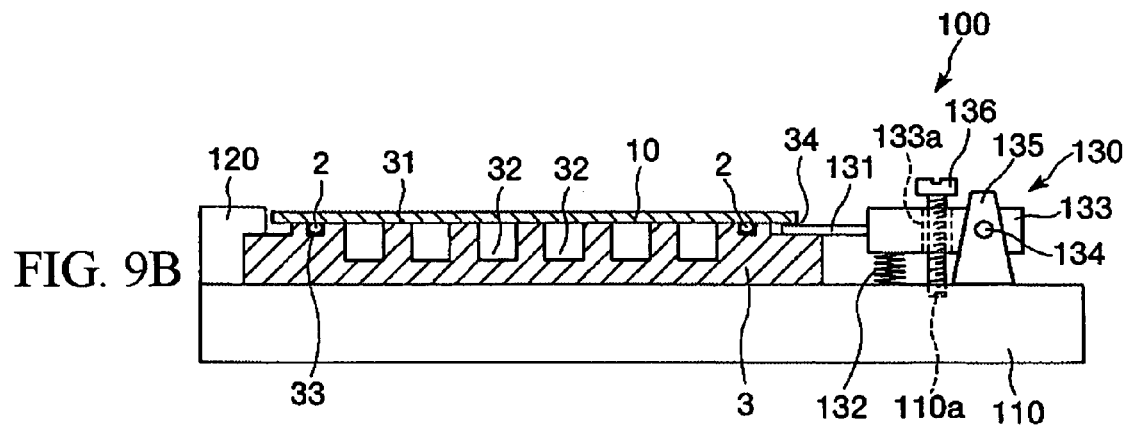
Figure 9C:
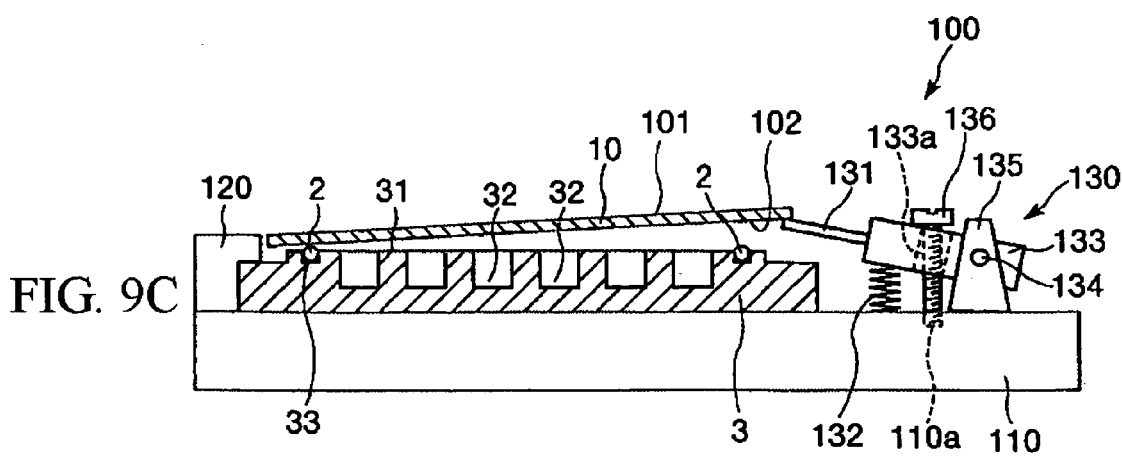

Next, a fifth embodiment of the surface treatment apparatus to be used in the present invention will be described. FIGS. 8A and 8B are fragmentally cross-sectional views which show the fifth embodiment of the surface treatment apparatus. FIGS. 9A to 9C are fragmentally cross-sectional views to be used for explaining the usage of the surface treatment apparatus shown in FIGS. 8A and 8B. In the following description, it is to be noted that the upper side and the lower side in FIGS. 8A and 8B and FIGS. 9A to 9C will be referred to as the "upper side" and the "lower side", respectively.

Hereinbelow, the surface treatment apparatus of the fifth embodiment will be described by focusing the difference between the first and fifth embodiments, and a description with regard to the overlapping points will be omitted. The surface treatment apparatus of the fifth embodiment is obtained by adding separation assisting means to the surface treatment apparatus of the first embodiment. The separation assisting means is used for assisting the separation of a substrate from the O-ring (which is a contact portion) in the step of releasing the substrate (that is, in the fourth step). It is preferred that the separation assisting means can be separated from the surface treatment apparatus so as to be used in only the step of releasing the substrate (that is, in only the fourth step).

A surface treatment apparatus 100 shown in FIGS. 8A and 8B includes a base 110 to be used for supporting the main body 3, and a fixing portion 120 to be used for fixing the main body 3 to the base 110. The main body 3 is placed on the base 110, and then the main body 3 is fixed to the base 110 by allowing the fixing portion 120 to come into contact with the edge portion of the main body 3. In this way, the main body 3 can be fixed to the base 110.

In this regard, it is to be noted that two or more of the fixing portions 120 are preferably provided so that the outer periphery of the main body 3 can be fixed at two or more positions. In this case, for example, three fixing portions 120 may be provided so that the main body 3 is fixed to the base 110 at a position shown in FIGS. 8A and 8B and positions on the both sides of a pin 131 (which will be described later) at the time when the pin 131 is in a first position (that is, in a position shown in FIG. 8A).

Further, as shown in FIGS. 8A and 9A, the surface treatment apparatus 100 of the present embodiment is formed so as to have a gap 34 between the peripheral portion 311 of the main body 3 and the substrate 10 with the substrate 10 being stuck to and held by the surface treatment apparatus 100 by suction. The pin 131 (described later) is inserted in this gap 34.

On an area of the base 110 other than an area where the main body 3 is to be placed, separation assisting means 130 is provided. The separation assisting means 130 includes the pin 131 (which is a part of a contact member having a cylindrical shape or a prismatic shape) to be inserted in the gap 34 between the substrate 10 and the main body 3, and a coil spring (which is displacement means) 132 to displace the pin 131 in the direction in which the pin 131 is separated from the main body 3 (that is, in the direction in which the pin 131 is separated from the O-ring 2).

One end portion of the pin 131, which is opposite to the other end portion positioned on the side of the O-ring 2 (that is, opposite to the other end portion positioned on the side of the main body 3), that is, the end portion of the pin 131 on the right side in FIGS. 8A and 8B is fixed to one end portion of a supporting portion 133 (which is a part of the contact member). In the other end portion of the supporting portion 133 (that is, in the end portion of the supporting portion 133 on the right side in FIGS. 8A and 8B), there is provided a rotation central shaft 134 (pivotal center). The rotation central shaft 134 (that is, the supporting portion 133) is rotatably supported by a bearing 135 provided on the base 110. Therefore, the pin 131 can be rotated (displaced) about the center which is positioned on the opposite side of the O-ring 2 (that is, the rotation central shaft 134) so as to be displaced between the first position (that is, a position shown in FIG. 8A) where the end portion of the pin 131 on the side of the O-ring 2 is close to the main body 3 (or close to the base 110) and a second position (that is, a position shown in FIG. 8B) where the end portion of the pin 131 on the side of the O-ring 2 is separated from the main body 3 (or separated from the base 110). In other words, the contact member constituted from the pin 131 and the supporting member 133 can be pivotally rotated with the rotation central shaft 134 being used as a pivotal center.

The coil spring 132 is provided between the supporting portion 133 and the base 110, and is positioned on the side close to the pin 131. The lower end portion of the coil spring 132 is fixed to the base 110. At least when the pin 131 is in the first position, the coil spring 132 is compressed so that the upper end portion thereof comes into contact with the supporting portion 133. Therefore, the coil spring 132 urges (biases) the pin 131 positioned in the first position upwardly (that is, the coil spring 132 urges (biases) the pin 131 positioned in the first position toward the second position).

By providing such separation assisting means 130, it is possible to reliably detach (release) the substrate 10 from the surface treatment apparatus 100 in the step of releasing the substrate (that is, in the fourth step) even in the case where the substrate 10 is relatively firmly stuck to the O-ring 2 due to, for example, elution of a plasticizer from the O-ring 2 in the etching step (that is, in the third step). In this regard, it is to be noted that the separation assisting means 130 may be formed so that the entire pin 131 can come close to or be separated from the base 110 (that is, so that the entire pin 131 can be displaced). However, as described above, by forming the separation assisting means 130 so that the pin 131 can be rotated about the center positioned on the side of one end of the pin 131 (that is, about the rotation central shaft 134), it is possible to simplify the structure of the displacement means.

Further, the surface treatment apparatus 100 has a screw (which is locking means) 136 to lock (keep) the pin 131 in the second position. The supporting portion 133 has a through hole 133a which passes through the supporting portion 133 in the thickness direction of the supporting portion 133. The base 110 has a threadedly engaging portion 110a in which the tip end portion of the screw 136 is to be threadedly engaged. The pin 131 is set in the first position by moving the pin 131 against the urging force (biasing force) of the coil spring 132, and then the screw 136 is inserted in the through hole 133a of the supporting portion 133. Then, the tip end portion of the screw 136 is threadedly engaged in the threadedly engaging portion 110a until slightly before the lower portion of a head of the screw 136 comes into contact with the supporting portion 133, and the screw 136 is slackened so that the head of the screw 136 gets away from the supporting portion 133 (see FIGS. 9A and 9B). This makes it possible to lock the pin 131 in the second position when the substrate 10 is detached from the surface treatment apparatus 100.

In this regard, it is to be noted that by adjusting the amount (depth) of the screw 136 to be inserted in the threadedly engaging portion 110a, it is possible to arbitrarily set the second position of the pin 131. That is, the distance that the pin 131 is displaced between the first position and the second position (that is, the rotation angle of the pin 131) can be arbitrarily set.

The surface treatment apparatus 100 of the fifth embodiment will provide the same effects as those described above with reference to the surface treatment apparatus 1 of the first embodiment. In particular, according to the surface treatment apparatus 100 of the present embodiment, it is possible to more reliably release (detach) the substrate 10 from the surface treatment apparatus 100 by virtue of the actions of both of the O-ring 2 and the separation assisting means 130. In this regard, it is to be noted that a leaf spring may also be used instead of the coil spring 132.

Next, a method of subjecting a substrate to surface treatment with the use of the surface treatment apparatus of the fifth embodiment (that is, a fifth method for surface treatment) will be described. In this regard, it is to be noted that the fifth method for surface treatment will be described by focusing the difference between the first and fifth methods, and a description with regard to the overlapping points will be omitted.

<1E> Decompression Step (First Step)

First, as described above, the main body 3 is separated from the base 110. Subsequently, the front surface 102 of the substrate 10 is brought into contact with the O-ring 2, and then the same step as the step <1A> described above is carried out.

<2E> Step in which the Substrate is Stuck to and Held by the Surface Treatment Apparatus by Suction (Second Step)

Next, the same step as the step <2A> described above is carried out. As a result, the substrate 10 is stuck to and held by the surface treatment apparatus 100 by suction.

<3E> Etching Step (Third Step)

Next, the same step as the step <3A> described above is carried out.

<4E> Step of Releasing the Substrate (Fourth Step)

First, the main body 3 is taken out of the bath, and is then placed on the base 110. Subsequently, as described above, the main body 3 is fixed to the base 110 by allowing the fixing portions 120 to come into contact with the edge portion of the main body 3. In this way, the main body 3 is fixed to the base 110 as shown in FIG. 9A. Further, the screw 136 is rotated (so that the tip end portion of the screw 136 is threadedly engaged in the threadedly engaging portion 110a and then the screw 136 is slightly slackened) to appropriately adjust the second position of the pin 131.

At this time, since one end portion of the pin 131 is being inserted in the gap 34, the pin 131 is slightly rotated toward the second position due to the action of the coil spring 132 (that is, due to the urging force of the coil spring 132), but the pin 131 is kept in a state where the one end portion thereof is in contact with the edge portion of the front surface 102 of the substrate 10 (that is, the pin 131 is kept in the first position) as shown in FIG. 9B.

Next, the surface treatment apparatus 100 by which the substrate 10 is held is again conveyed to the vacuum chamber (decompression chamber), and then the vacuum chamber is decompressed. As a result, the pressure within the concave portions 32 becomes substantially equal to or higher than the external pressure (that is, the pressure within the concave portions 32 becomes substantially equal to or higher than the pressure within the vacuum chamber) so that pressing force is exerted on the substrate 10 in the direction in which the substrate 10 is separated from the substrate contact surface 31 (that is, in the upward direction in FIG. 9) due to the pressure difference.

Further, as described above, since one end portion of the pin 131 is in contact with the edge portion of the front surface 102 of the substrate 10, the edge portion of the substrate 10 is being pressed in the direction in which the pin 131 is displaced from the first position to the second position (that is, in the upward direction in FIG. 9). According to the surface treatment apparatus 100 of the present embodiment, as shown in FIG. 9C, it is possible to more reliably release (detach) the substrate 10 from the surface treatment apparatus 100 due to the pressing force caused by both of the pressure difference and the separation assisting means 130.

In this regard, it is to be noted that since the pin 131 is kept in the second position by virtue of the screw 136, there is no possibility that too much force is exerted on the substrate 10 upon the detachment of the substrate 10 so that the substrate 10 is thrown up. Further, the distance between the first position and the second position, that is, the distance that the one end portion of the pin 131 on the side of the O-ring 2 (which is the end portion that is in contact with the substrate 10) is displaced between the first position and the second position is not limited to any specific value, but it is preferably in the range of about 1 to 5 mm.

<Sixth Embodiment>

Figure 10A:
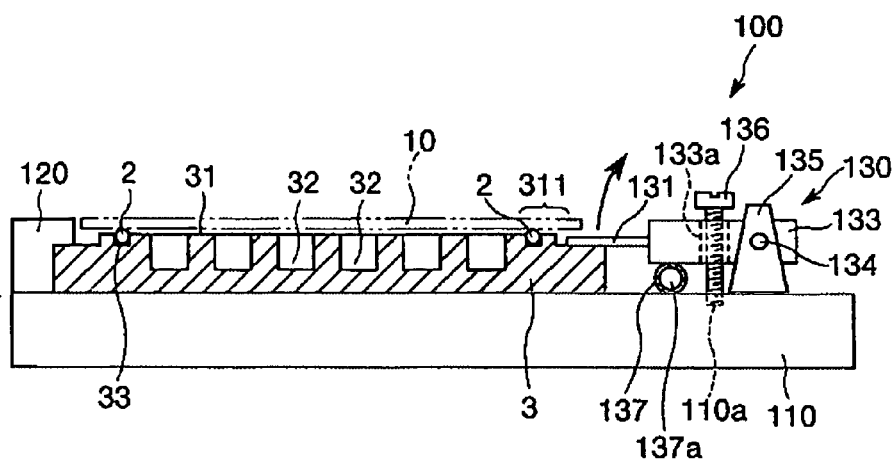
FIGS. 10A and 10B are partially cross-sectional views which show a surface treatment apparatus in a sixth embodiment.
Figure 10B:
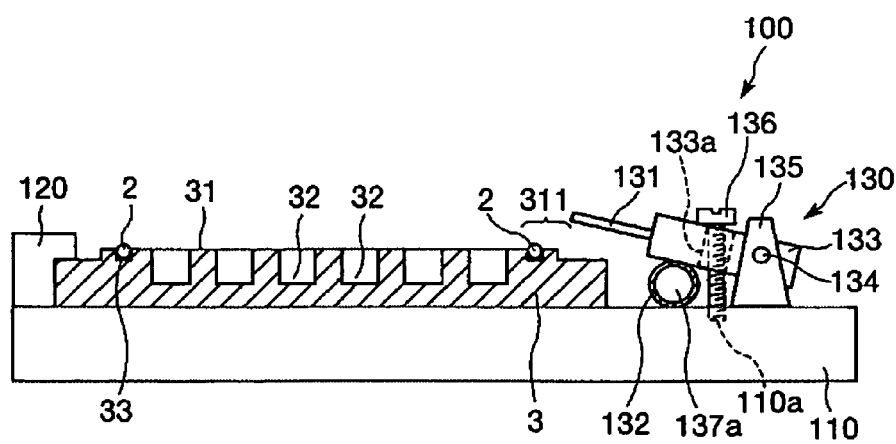

Next, a sixth embodiment of the surface treatment apparatus to be used in the present invention will be described. FIGS. 10A and 10B are fragmentally cross-sectional views which show the sixth embodiment of the surface treatment apparatus. In the following description, it is to be noted that the upper side and the lower side in FIGS. 10A and 10B will be referred to as the "upper side" and the "lower side", respectively.

Hereinbelow, the surface treatment apparatus of the sixth embodiment will be described by focusing differences between the first and fifth embodiments and the sixth embodiment, and a description with regard to the overlapping points will be omitted.

The surface treatment apparatus of the sixth embodiment is the same as the surface treatment apparatus of the fifth embodiment except for the structure of the displacement means. The surface treatment apparatus 100 shown in FIGS. 10A and 10B has an elastic member 137 having a spherical shape as the displacement means. The elastic member 137 includes a hollow space 137a which in increased in volume when the elastic member 137 is subjected to a reduced pressure by decompressing a decompression chamber. The elastic member 137 is formed so as to have an outer diameter substantially the same as the distance between the supporting portion 133 and the base 110 at about atmospheric pressure (that is, at normal pressure). When the elastic member 137 is subjected to a reduce pressure by decompressing the decompression chamber, the volume of the hollow space 137a is increased so that the outer diameter of the elastic member 137 is also increased. As a result, the supporting portion 133 is rotated about the rotation central shaft 134 so that the pin 131 is rotated (displaced) from the first position (that is, a position shown in FIG. 10A) to the second position (that is, a position shown in FIG. 10B).

As a constituent material of the elastic member 137, the same materials as those mentioned above with reference to the O-ring 2 can be used. The surface treatment apparatus 100 of the sixth embodiment will provide the same effects as those of the surface treatment apparatus 100 of the fifth embodiment. In this regard, it is to be noted that the outer shape (entire shape) of the elastic member 137 is not limited to a spherical shape. The elastic member 137 may have any shape such as a cube, a rectangular parallelepiped, or the like.

Next, a method of subjecting a substrate to surface treatment with the use of the surface treatment apparatus of the sixth embodiment (that is, a sixth method for surface treatment) will be described. In this regard, it is to be noted that the sixth method for surface treatment will be described by focusing the difference between the fifth and sixth methods, and a description with regard to the overlapping points will be omitted.

<1F> Decompression Step (First Step)

First, the same step as the step <1E> described above is carried out.

<2F> Step in which the Substrate is Stuck to and Held by the Surface Treatment Apparatus by Suction (Second Step)

Next, the same step as the step <2E> described above is carried out.

<3F> Etching Step (Third Step)

Next, the same step as the step <3E> described above is carried out.

<4F> Step of Releasing the Substrate (Fourth Step)

First, the main body 3 is taken out of the bath, and is then placed on the base 110. Subsequently, as described above, the main body 3 is fixed to the base 110 by allowing the fixing portions 120 to come into contact with the edge portion of the main body 3. In this way, the main body 3 is fixed to the base 110. Further, the screw 136 is rotated (so that the tip end portion of the screw 136 is threadedly engaged in the threadedly engaging portion 110a and then the screw 136 is slightly slackened) to appropriately adjust the second position of the pin 131.

Next, the surface treatment apparatus 100 by which the substrate 10 is held is again conveyed to the vacuum chamber (decompression chamber), and then the vacuum chamber is decompressed. As a result, the pressure within the concave portions 32 becomes substantially equal to or higher than the external pressure (that is, the pressure within the concave portions 32 becomes substantially equal to or higher than the pressure within the vacuum chamber) so that pressing force is exerted on the substrate 10 in the direction in which the substrate 10 is separated from the substrate contact surface 31 (that is, in the upward direction in FIG. 10) due to the pressure difference. Further, at this time, as the vacuum chamber is decompressed, the volume of the hollow space 137a is increased so that the outer diameter of the elastic member 137 is increased. As a result, the elastic member 137 presses the supporting portion 133 upwardly, and then the pin 131 is started to rotate (displace) toward the second position so that the one end portion of the pin 131 comes into contact with the edge portion of the front surface 102 of the substrate 10 to press the edge portion of the substrate 10 upwardly. According to the surface treatment apparatus 100 of the present embodiment, it is possible to more reliably release (detach) the substrate 10 from the surface treatment apparatus 100 due to the pressing force caused by both of the pressure difference and the separation assisting means 130.

<Seventh Embodiment>

Figure 11:
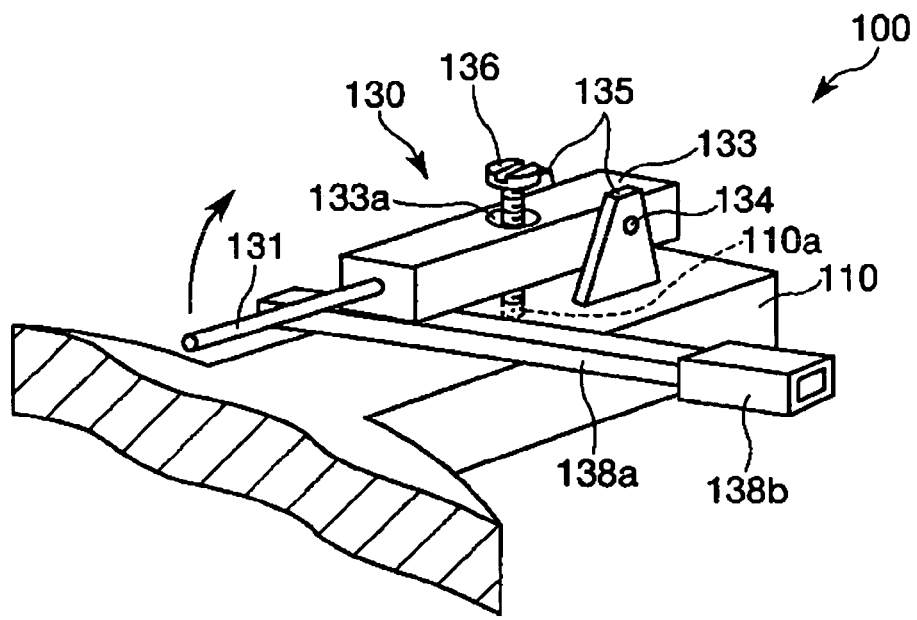
FIG. 11 is a perspective view which shows a part (which is separation assisting means) of a surface treatment apparatus in a seventh embodiment.

Next, a seventh embodiment of the surface treatment apparatus to be used in the present invention will be described. FIG. 11 is a perspective view which shows a part (which is separation assisting means) of the seventh embodiment of the surface treatment apparatus. In the following description, it is to be noted that the upper side and the lower side in FIG. 11 will be referred to as the "upper side" and the "lower side", respectively.

Hereinbelow, the surface treatment apparatus of the seventh embodiment will be described by focusing differences between the first and fifth embodiments and the seventh embodiment, and a description with regard to the overlapping points will be omitted. The surface treatment apparatus of the seventh embodiment is the same as the surface treatment apparatus of the fifth embodiment except for the structure of the displacement means. The displacement means of the surface treatment apparatus 100 shown in FIG. 11 includes a lever 138a and a weight 138b.

One end portion of the lever 138a is inserted in the space between the base 110 and the supporting portion 133. The weight 138b is attached to the other end portion of the lever 138a. Since the weight 138b is attached to the other end portion of the lever 138a, force is exerted on the one end portion of the lever 138a in the upward direction in FIG. 11. Therefore, the supporting portion 133 is pressed in the upward direction so that the pin 131 is rotated (displaced) toward the second position. The surface treatment apparatus 100 of the seventh embodiment will provide the same effects as those described above with reference to the surface treatment apparatus 100 of the fifth embodiment. In this regard, it is to be noted that, in the present embodiment, the lever 138a and the weight 138b are separate members, but they may be combined into a single member. Further, the pin 131 may be directly used as a lever.

Next, a method of subjecting a substrate to surface treatment with the use of the surface treatment apparatus of the seventh embodiment (that is, a seventh method for surface treatment) will be described. In this regard, it is to be noted that the seventh method for surface treatment will be described by focusing the difference between the fifth and seventh methods, and a description with regard to the overlapping points will be omitted.

<1G> Decompression Step (First Step)

First, the same step as the step <1E> described above is carried out.

<2G> Step in which the Substrate is Stuck to and Held by the Surface Treatment Apparatus by Suction (Second Step)

Next, the same step as the step <2E> described above is carried out.

<3G> Etching Step (Third Step)

Next, the same step as the step <3E> described above is carried out.

<4G> Step of Releasing the Substrate (Fourth Step)

First, the main body 3 is taken out of the bath, and is then placed on the base 110. Subsequently, as described above, the main body 3 is fixed to the base 110 by allowing the fixing portions 120 to come into contact with the edge portion of the main body 3. In this way, the main body 3 is fixed to the base 110. Further, the screw 136 is rotated (so that the tip end portion of the screw 136 is threadedly engaged in the threadedly engaging portion 110a and then the screw 136 is slightly slackened) to appropriately adjust the second position of the pin 131.

At this time, since one end portion of the pin 131 is being inserted in the gap 34, the pin 131 is slightly rotated toward the second position due to the action of the displacement means constituted from the lever 138a and the weight 138b, but the pin 131 is kept in a state where the one end portion thereof is in contact with the edge portion of the front surface 102 of the substrate 10 (that is, the pin 131 is kept in the first position).

Next, the surface treatment apparatus 100 by which the substrate 10 is held is again conveyed to the vacuum chamber (decompression chamber), and then the vacuum chamber is decompressed. As a result, the pressure within the concave portions 32 becomes substantially equal to or higher than the external pressure (that is, the pressure within the concave portions 32 becomes substantially equal to or higher than the pressure within the vacuum chamber) so that pressing force is exerted on the substrate 10 in the direction in which the substrate 10 is separated from the substrate contact surface 31 (that is, in the upward direction in FIG. 11) due to the pressure difference. Further, as described above, since the one end portion of the pin 131 is in contact with the edge portion of the front surface 102 of the substrate 10, the edge portion of the substrate 10 is being pressed in the direction in which the pin 131 is displaced from the first position to the second position (that is, in the upward direction). According to the surface treatment apparatus 100 of the present embodiment, it is possible to more reliably release (detach) the substrate 10 from the surface treatment apparatus 100 due to the pressing force caused by both of the pressure difference and the separation assisting means 130.

<Eighth Embodiment>

Figure 12:
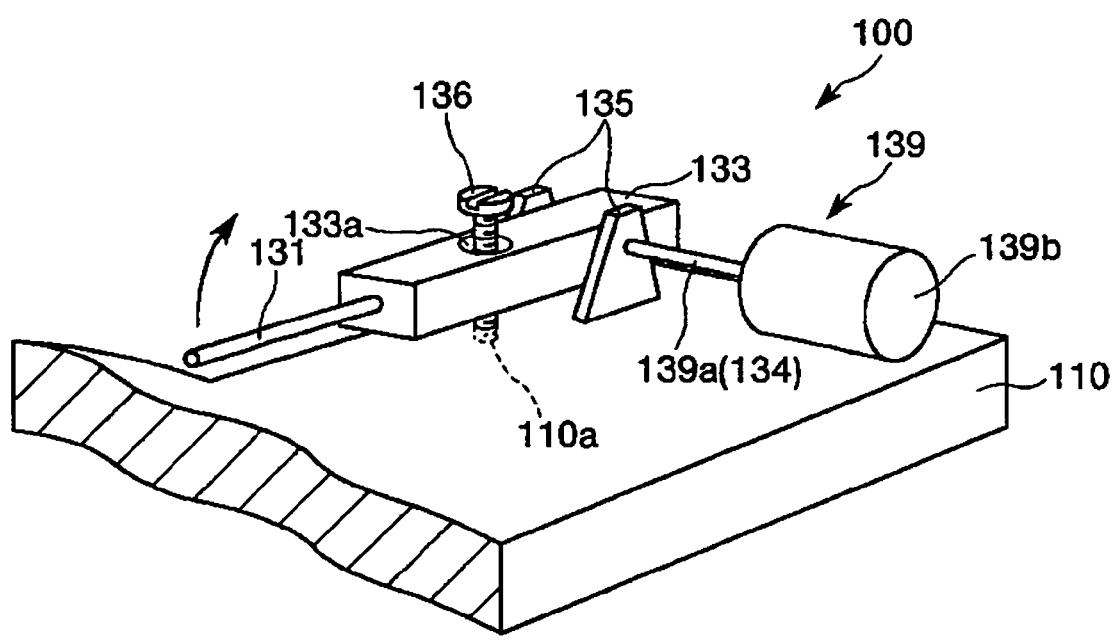
FIG. 12 is a perspective view which shows a part (which is separation assisting means) of a surface treatment apparatus in an eighth embodiment.

Next, an eighth embodiment of the surface treatment apparatus to be used in the present invention will be described. FIG. 12 is a perspective view which shows a part (which is separation assisting means) of the eighth embodiment of the surface treatment apparatus. In the following description, it is to be noted that the upper side and the lower side in FIG. 12 will be referred to as the "upper side" and the "lower side", respectively.

Hereinbelow, the surface treatment apparatus of the eighth embodiment will be described by focusing differences between the first and fifth embodiments and the eighth embodiment, and a description with regard to the overlapping points will be omitted. The surface treatment apparatus of the eighth embodiment is the same as the surface treatment apparatus of the fifth embodiment except for the structure of the displacement means. The surface treatment apparatus 100 shown in FIG. 12 has a motor 139 as the displacement means.

The motor 139 includes a rotation shaft 139*a* and a main body 139*b*. In the present embodiment, the rotation shaft 139*a* also serves as the rotation central shaft 134 of the supporting portion 133. Alternatively, the rotation shaft 139*a* may be engaged with the rotation central shaft 134a of the supporting portion 133 via a gear or the like. The main body 139*b* is fixed to the base 110. The surface treatment apparatus 100 of the eighth embodiment will provide the same effects as those described above with reference to the surface treatment apparatus 100 of the fifth embodiment.

Next, a method of subjecting a substrate to surface treatment with the use of the surface treatment apparatus of the eighth embodiment (that is, an eighth method for surface treatment) will be described. In this regard, it is to be noted that the eighth method for surface treatment will be described by focusing the difference between the fifth and eighth methods, and a description with regard to the overlapping points will be omitted.

<1H> Decompression Step (First Step)

First, the same step as the step <1E> described above is carried out.

<2H> Step in which the Substrate is Stuck to and Held by the Surface Treatment Apparatus by Suction (Second Step)

Next, the same step as the step <2E> described above is carried out.

<3H> Etching Step (Third Step)

Next, the same step as the step <3E> described above is carried out.

<4H> Step of Releasing the Substrate (Fourth Step)

First, the main body 3 is taken out of the bath, and is then placed on the base 110. Subsequently, as described above, the main body 3 is fixed to the base 110 by allowing the fixing portions 120 to come into contact with the edge portion of the main body 3. In this way, the main body 3 is fixed to the base 110.

Further, the screw 136 is rotated (so that the tip end portion of the screw 136 is threadedly engaged in the threadedly engaging portion 110*a* and then the screw 136 is slightly slackened) to appropriately adjust the second position of the pin 131. Then, the motor 139 is driven. At this time, since one end portion of the pin 131 is being inserted in the gap 34, the pin 131 is slightly rotated toward the second position due to the driving force of the motor 139, but the pin 131 is kept in a state where the one end portion thereof is in contact with the edge portion of the front surface 102 of the substrate 10 (that is, the pin 131 is kept in the first position).

Next, the surface treatment apparatus 100 by which the substrate 10 is held is again conveyed to the vacuum chamber (decompression chamber), and then the vacuum chamber is decompressed. As a result, the pressure within the concave portions 32 becomes substantially equal to or higher than the external pressure (that is, the pressure within the concave portions 32 becomes substantially equal to or higher than the pressure within the vacuum chamber) so that pressing force is exerted on the substrate 10 in the direction in which the substrate 10 is separated from the substrate contact surface 31 (that is, in the upward direction in FIG. 12) due to the pressure difference. Further, as described above, since the one end portion of the pin 131 is in contact with the edge portion of the front surface 102 of the substrate 10, the edge portion of the substrate 10 is being pressed in the direction in which the pin 131 is displaced from the first position to the second position (that is, in the upward direction).

According to the surface treatment apparatus 100 of the present embodiment, it is possible to more reliably release (detach) the substrate 10 from the surface treatment apparatus 100 due to the pressing force caused by both of the pressure difference and the separation assisting means 130.

As described above, each of the above-described separation assisting means 130 constituted from the contact member (that is, the pin 131) and the displacement means has a simple structure, and the use of such separation assisting means 130 makes it possible to reliably release the substrate 10 from the surface treatment apparatus 100. Further, since the structure of each of the displacement means described above with reference to the fifth to eighth embodiments is very simple, it is possible to prevent an increase in the number of components of the surface treatment apparatus 100 and an increase in manufacturing costs of the surface treatment apparatus 100.

Since each of the surface treatment apparatuses described above can hermetically secure (hold) a substrate, it is possible to reliably prevent various liquids from intruding into the inside of the substrate while the substrate is being secured to the surface treatment apparatus. Therefore, in particular, such a surface treatment apparatus is suitably used in subjecting a substrate to surface treatment with the use of a liquid for treatment. As for surface treatment with the use of a liquid for surface treatment, for example, plating or ion exchange employed in manufacture of tempered glass can be mentioned in addition to wet etching mentioned above.

The method for surface treatment of the present invention has been described with reference to the embodiments shown in the drawings, but the present invention is not limited thereto. For example, any two or more of the structures of the first to eighth embodiments may be combined into a single surface treatment apparatus. Further, so long as the same or similar functions are achieved, it is possible to make various changes and additions to each portion of the surface treatment apparatus.

Furthermore, the method for surface treatment of the present invention may include steps other than the steps described above depending on particular objectives, as necessary. Moreover, in each of the embodiments described above, a description has been made with reference to a case where the surface treatment apparatus is conveyed to the decompression chamber while the enclosed spaces are covered with the substrate (that is, while the substrate is in contact with the surface treatment apparatus), and then the decompression chamber is decompressed. However, the enclosed spaces may be covered with the substrate after the decompression chamber is decompressed while the substrate is separated from the surface treatment apparatus (that is, while the enclosed spaces are not covered with the substrate).

What is claimed is:

1. A method for surface treatment for a substrate using a surface treatment apparatus, the substrate having one surface to which the surface treatment is to be carried out and the other surface opposite to the one surface, and the surface treatment apparatus having at least one enclosed space and a contact portion surrounding the enclosed space adapted to hermetically contact with the other surface of the substrate to produce negative pressure in cooperation with the enclosed space and the other surface of the substrate so that the substrate is attracted onto the surface treatment apparatus by means of the negative pressure to maintain such a state at least during the surface treatment, the method comprising:

a first step in which the surface treatment apparatus and the substrate placed thereon in a state where the other surface of the substrate faces the surface treatment apparatus are conveyed to the inside of a decompression chamber to decompress the enclosed space thereby producing the negative pressure in the enclosed space;

a second step in which the surface treatment apparatus and the substrate are brought out from the inside of the decompression chamber to environment under atmospheric pressure in a state where the substrate is being attracted to the surface treatment apparatus with the use of a difference between the negative pressure inside the closed space and atmospheric pressure; and a third step in which the surface treatment is carried out to the one surface of the substrate under the condition that the substrate is being attracted by the surface treatment apparatus.

2. The method for surface treatment as claimed in claim 1, wherein the pressure within the decompression chamber in the first step is 70,000 Pa or less.

3. The method for surface treatment as claimed in claim 1, wherein the surface treatment in the third step is carried out under atmospheric pressure or higher pressure.

4. The method for surface treatment as claimed in claim 1, further comprising:

a fourth step after the third step, in which the surface treatment apparatus with the substrate is conveyed to the inside of the decompression chamber again, in which the substrate is released from the surface treatment apparatus by decompressing the inside of the decompression chamber so that the pressure within the decompression chamber becomes substantially equal to or lower than the pressure within the decompression chamber in the first step.

5. The method for surface treatment as claimed in claim 4, wherein, when the pressure within the decompression chamber in the first step is defined as A (Pa) and the pressure within the decompression chamber in the fourth step is defined as B (Pa), the relationship that B/A is 1 or less is satisfied.

6. The method for surface treatment as claimed in claim 4, wherein the pressure within the decompression chamber in the fourth step is 70,000 Pa or less.

7. The method for surface treatment as claimed in claim 4, wherein the surface treatment apparatus further includes separation assisting means which assists separation of the substrate from the contact portion of the surface treatment apparatus in the decompression chamber.

8. The method for surface treatment as claimed in claim 7, wherein the separation assisting means includes a contact member having one end portion which is adapted to contact with the other surface of the substrate when the substrate is separated from the contact portion of the surface treatment apparatus, and displacement means for displacing the contact member in a direction in which the contact member is separated from the contact portion.

9. The method for surface treatment as claimed in claim 8, wherein the contact member has the other end portion opposite to the one end portion thereof, and the contact member can be pivotally rotated with the other end portion being used as a pivotal center.

10. The method for surface treatment as claimed in claim 8, wherein the displacement means is constituted from a spring.

11. The method for surface treatment as claimed in claim 8, wherein the displacement means is constructed from an elastic member having a hollow space in which the volume of the hollow space is increased by decompressing the inside of the decompression chamber.

12. The method for surface treatment as claimed in claim 8, wherein the displacement means is constructed from a lever and a weight.

13. The method for surface treatment as claimed in claim 8, wherein the displacement means is constituted from a motor.

14. The method for surface treatment as claimed in claim 1, wherein the surface treatment apparatus has a flow path which allows the enclosed space to communicate with the outside thereof with the substrate being contact with the contact portion wherein the flow path is hermetically sealed in the first, second and third steps; and wherein the method for surface treatment further comprises:

a fourth step after the third step, in which the substrate is released from the surface treatment apparatus by opening the flow path.

15. The method for surface treatment as claimed in claim 1, wherein the substrate has one or more concave portions each opening to the other surface thereof; and wherein the method for surface treatment further comprises the step of:

prior to the first step, providing a sheet-shaped material on the other surface of the substrate so that the concave portions of the substrate can be covered.

16. The method for surface treatment as claimed in claim 1, wherein the substrate has one or more concave portions each opening to the other surface thereof; and wherein the contact portion is constituted so as to be able to cover the concave portions of the substrate with the substrate being contact with the contact portion.

17. The method for surface treatment as claimed in claim 1, wherein the surface treatment apparatus has a flat-shaped structure having two major surfaces, and has the concave portion on the side of each of the two major surfaces.

18. The method for surface treatment as claimed in claim 1, wherein the surface treatment is carried out using a liquid for treatment.

19. The method for surface treatment as claimed in claim 18, wherein the liquid for treatment includes an etchant.

* * * * *